US011815560B2

(12) United States Patent
Shier

(10) Patent No.: US 11,815,560 B2
(45) Date of Patent: Nov. 14, 2023

(54) METHODS AND SYSTEMS FOR WIRE HARNESS TEST RESULTS ANALYSIS

(71) Applicant: DIT-MCO INTERNATIONAL LLC, Kansas City, MO (US)

(72) Inventor: David Alan Shier, Lee's Summit, MO (US)

(73) Assignee: DIT-MCO INTERNATIONAL LLC, Kansas City, MO (US)

( * ) Notice: Subject to any disclaimer, the term of this patent is extended or adjusted under 35 U.S.C. 154(b) by 61 days.

(21) Appl. No.: 17/163,613

(22) Filed: Feb. 1, 2021

(65) Prior Publication Data

US 2021/0247463 A1 Aug. 12, 2021

Related U.S. Application Data

(60) Provisional application No. 62/995,729, filed on Feb. 12, 2020.

(51) Int. Cl.
*G01R 31/54* (2020.01)
*G01R 31/60* (2020.01)

(52) U.S. Cl.
CPC ............ *G01R 31/54* (2020.01); *G01R 31/60* (2020.01)

(58) Field of Classification Search
CPC ........ G01R 31/54; G01R 31/60; G01R 1/025; G01R 31/005; G01R 31/2846; G01R 31/52
See application file for complete search history.

(56) References Cited

U.S. PATENT DOCUMENTS

| 4,257,002 | A | * | 3/1981 | Helms | G01R 31/60 |
| | | | | | 379/21 |
| 5,811,977 | A | | 9/1998 | Gilles | |
| 6,167,352 | A | | 12/2000 | Kanevsky et al. | |
| 6,518,772 | B1 | | 2/2003 | Milkovic et al. | |
| 6,687,639 | B2 | | 2/2004 | Taniguchi et al. | |
| 7,952,360 | B2 | | 5/2011 | Ganesh | |
| 7,974,815 | B2 | * | 7/2011 | Blemel | F17D 5/02 |
| | | | | | 702/183 |
| 8,024,610 | B2 | * | 9/2011 | de Kleer | G06F 11/2257 |
| | | | | | 714/33 |
| 8,912,800 | B2 | * | 12/2014 | Gervais | G01R 31/58 |
| | | | | | 324/540 |
| 9,250,283 | B2 | * | 2/2016 | Johnson | G01R 31/11 |

(Continued)

FOREIGN PATENT DOCUMENTS

CA 1227875 * 10/1987 ............ G06F 11/20

*Primary Examiner* — Alessandro V Amari
*Assistant Examiner* — Sharah Zaab
(74) *Attorney, Agent, or Firm* — HOVEY WILLIAMS LLP

(57) ABSTRACT

A computer-implemented method of analyzing an electrical wiring harness assembly comprises receiving, via a processing element, a test result associated with the electrical wiring harness assembly; determining, via the processing element, a probable error type based on the test result; retrieving from a memory element, via the processing element, a plurality of natural language terms associated with the probable error type, each of the plurality of natural language terms having a corresponding phrase order value; and reporting, via a user interface, each of the plurality of natural language terms in an order according to the phrase order values.

15 Claims, 9 Drawing Sheets

(56) References Cited

U.S. PATENT DOCUMENTS

| | | | | |
|---|---|---|---|---|
| 9,495,352 B1* | 11/2016 | Smyros | ............... | G06F 40/205 |
| 9,589,049 B1* | 3/2017 | Carrier | ............... | G06F 16/3326 |
| 9,672,497 B1* | 6/2017 | Lewis | ............... | G06F 40/284 |
| 9,710,836 B1* | 7/2017 | O'Malley | ............ | G06Q 30/0607 |
| 2005/0234682 A1* | 10/2005 | Graves | ............... | H04L 41/12 |
| | | | | 703/1 |
| 2009/0326947 A1* | 12/2009 | Arnold | ............... | G06Q 30/02 |
| | | | | 707/999.005 |
| 2015/0130503 A1* | 5/2015 | Concepcion | ......... | G01R 31/346 |
| | | | | 324/765.01 |
| 2019/0180195 A1* | 6/2019 | Terry | ............... | G06N 20/00 |
| 2020/0082027 A1* | 3/2020 | Haumer | ............... | G06F 16/335 |

* cited by examiner

Fig. 8.

| Error_type | Term | Foreign_key | Language | Phase_order |
|---|---|---|---|---|
| Open in Component | Continuity failure | | English | 1 |
| Open in Component | falla de continuidad | | Spanish | 2 |
| Open in Component | between | Output_point | English | 2 |
| Open in Component | entre | Output_point | Spanish | 3 |
| Open in Component | and | Input_point | English | 3 |
| Open in Component | y | Input_point | Spanish | 4 |
| Open in Component | most likely | | English | 4 |
| Open in Component | Lo más probable es que | | Spanish | 1 |
| Open in Component | is caused by | | English | 5 |
| Open in Component | es causado por | | Spanish | 5 |
| Open in Component | pins | Component_pin_1 | English | 6 |
| Open in Component | pines | Component_pin_1 | Spanish | 6 |
| Open in Component | and | Component_pin_2 | English | 7 |
| Open in Component | y | Component_pin_2 | Spanish | 7 |
| Open in Component | , or | Component_pin_3 | English | 8 |
| Open in Component | , o | Component_pin_3 | Spanish | 8 |
| Open in Component | and | Component_pin_4 | English | 9 |
| Open in Component | y | Component_pin_4 | Spanish | 9 |
| Open in Component | reversed | | English | 10 |
| Open in Component | intercambiar | | Spanish | 10 |
| Open in Component | in | Component_type | English | 11 |
| Open in Component | en | Component_type | Spanish | 11 |
| Open in Component | | Component_type | English | 12 |
| Open in Component | | Component_type | Spanish | 12 |
| Open in Component | . | | English | 13 |
| Open in Component | . | | Spanish | 13 |

METHODS AND SYSTEMS FOR WIRE HARNESS TEST RESULTS ANALYSIS

RELATED APPLICATIONS

This application claims the benefit of U.S. Provisional Application Ser. No. 62/995,729, filed Feb. 12, 2020, entitled METHODS AND SYSTEMS FOR WIRE HARNESS TEST RESULTS ANALYSIS, the entire disclosure of which is hereby incorporated by reference herein.

BACKGROUND

In the manufacturing or installation of electrical wiring systems and harnesses, it is necessary to verify the continuity of the conductors. Automatic test equipment (ATE) run automated test scripts that include measuring electrical characteristics in order to predict continuity. ATE require a plurality of interface adapters to connect to all conductors to be tested simultaneously, such that a test script can run automatically with little or no operator intervention after the test is started. The results of such tests are typically shown as individual measurements of continuity or short-circuit resistances from one end point of a wire system to another end point. These reports do not provide the specific point of failure, but rather rely on the expertise or experience of the test technician to troubleshoot the faults indicated. Such expert technicians may reference schematic wiring diagrams and/or execute supplemental electrical testing of the unit under test (UUT) in order to isolate the reported faults. These troubleshooting methods are often not documented, but instead depend on the skill of the specialist. Thus, troubleshooting is often time-consuming and expensive in terms of skilled labor costs.

Various hardware or software solutions have been developed to overcome this limitation. One solution utilizes measuring the electrical capacitance of the open wire to adjacent wires (or the common ground) from both ends of the open circuit in an attempt to determine the relative distance to the break. However, there are numerous failure modes that lead to inconclusive results for such capacitance measurements. Another method employs time-domain reflectometry (TDR) to measure the distance to a disconnect. Again, while TDR measurements are highly effective for finding failures in lengthy, impedance-matched transmission lines, they have not proven to be reliable in the multi-node wire harnesses that have numerous reflection points which are typical in aerospace, transportation, and other industries that use electrical wiring harness assemblies.

Other solutions rely on the development of graphical representations of the UUT which requires significant engineering resources, which is impractical for low-volume testing. Finally, statistical analysis of past root cause determinations has been used to suggest possible causes for current failures. However, because of the low production volumes of high-value cable systems, such as for the aerospace industry, there is little to no statistical significance associated with historical test results. Thus, such solutions are of minimal value for testing such low-volume, high-value systems.

The background discussion is intended to provide information related to the present invention which is not necessarily prior art.

SUMMARY

The present invention solves the above-described problems and other problems and provides methods and systems for the evaluation of the results of testing electrical wiring harness assemblies that enables dynamic test results analysis and that is user friendly.

A computer-implemented method of analyzing an electrical wiring harness assembly according to an embodiment of the present invention comprises receiving, via a processing element, a test result associated with the electrical wiring harness assembly; determining, via the processing element, a probable error type based on the test result; retrieving from a memory element, via the processing element, a plurality of natural language terms associated with the probable error type, each of the plurality of natural language terms having a corresponding phrase order value; and reporting via a user interface, via the processing element, each of the plurality of natural language terms in an order according to the phrase order values.

A system for analyzing an electrical wiring harness assembly constructed according to an embodiment of the present invention comprises a harness interface, a stimulus and measurement device, a memory element, a user interface, and a processing element. The harness interface contacts two or more pins of the electrical wiring harness assembly. The stimulus and measurement device is connected to the harness interface and is configured to measure one or more electrical characteristic of the electrical wiring harness assembly. The memory element is configured to store a plurality of error types in association with a plurality of natural language terms and phrase order values. The user interface includes a display configured to display text.

The processing element is in communication with the stimulus and measurement device, the memory element, and the user interface. The processing element is configured to receive a signal representative of a test result from the stimulus and measurement device; determine a probable error type based on the test result; retrieve from the memory element a plurality of natural language terms associated with the probable error type, each of the plurality of terms having a corresponding phrase order value; and direct the user interface to display each of the plurality of terms in an order according to the phrase order values.

This summary is provided to introduce a selection of concepts in a simplified form that are further described below in the detailed description. This summary is not intended to identify key features or essential features of the claimed subject matter, nor is it intended to be used to limit the scope of the claimed subject matter. Other aspects and advantages of the present invention will be apparent from the following detailed description of the embodiments and the accompanying drawing figures.

BRIEF DESCRIPTION OF THE DRAWING FIGURES

Embodiments of the present invention are described in detail below with reference to the attached drawing figures, wherein:

FIG. 8 is an exemplary table stored on a memory element of the test system of FIG. 1.

Figure 1:
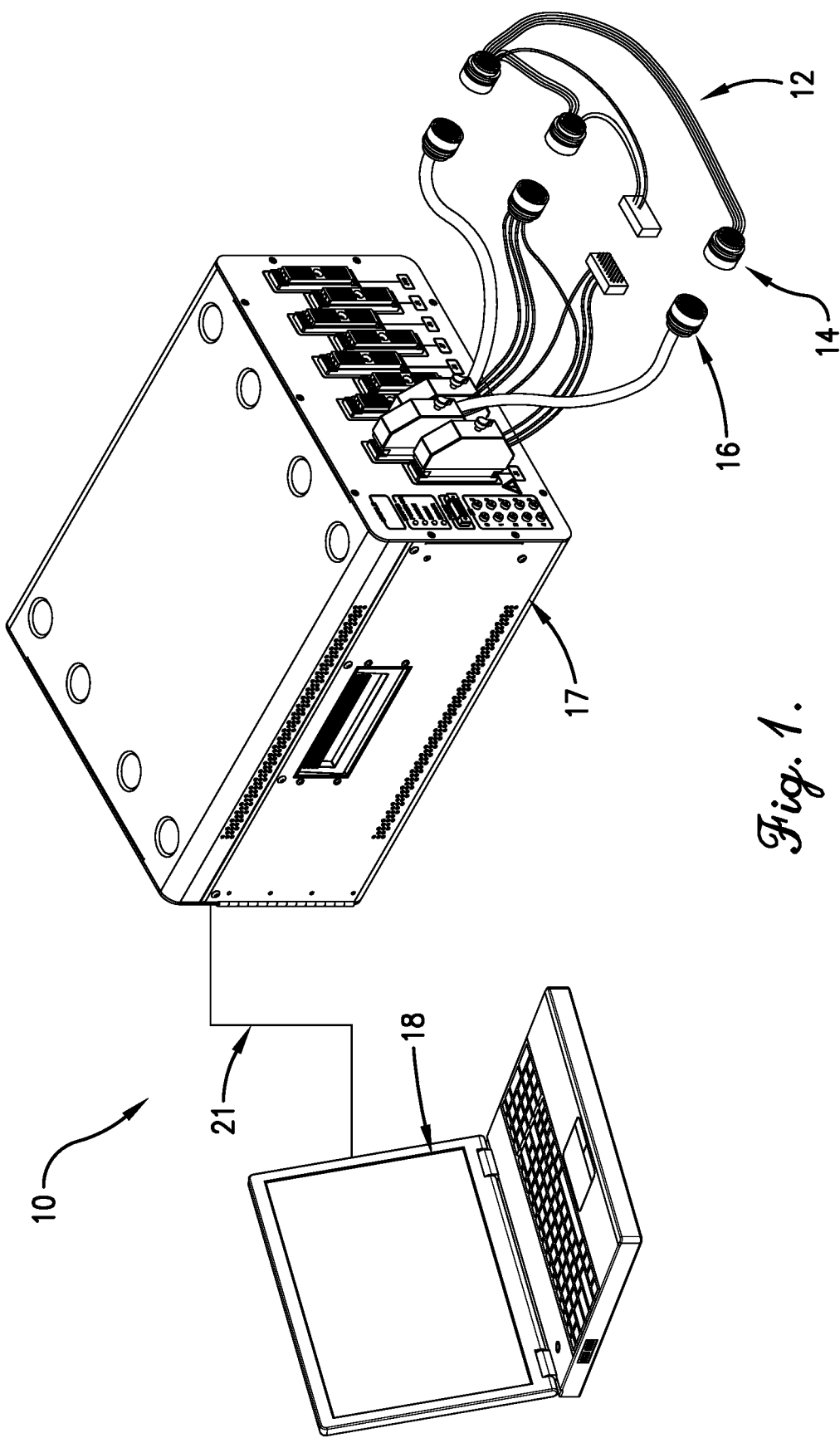
FIG. 1 is a perspective view of an exemplary test system for implementing embodiments of the present invention connected to an exemplary unit under test.

The drawing figures do not limit the present invention to the specific embodiments disclosed and described herein. The drawings are not necessarily to scale, emphasis instead being placed upon clearly illustrating the principles of the invention.

DETAILED DESCRIPTION OF THE EMBODIMENTS

The following detailed description of the invention references the accompanying drawings that illustrate specific embodiments in which the invention can be practiced. The embodiments are intended to describe aspects of the invention in sufficient detail to enable those skilled in the art to practice the invention. Other embodiments can be utilized and changes can be made without departing from the scope of the present invention. The following detailed description is, therefore, not to be taken in a limiting sense. The scope of the present invention is defined only by the appended claims, along with the full scope of equivalents to which such claims are entitled.

In this description, references to "one embodiment", "an embodiment", or "embodiments" mean that the feature or features being referred to are included in at least one embodiment of the technology. Separate references to "one embodiment", "an embodiment", or "embodiments" in this description do not necessarily refer to the same embodiment and are also not mutually exclusive unless so stated and/or except as will be readily apparent to those skilled in the art from the description. For example, a feature, structure, act, etc. described in one embodiment may also be included in other embodiments, but is not necessarily included. Thus, the present technology can include a variety of combinations and/or integrations of the embodiments described herein.

Figure 2:
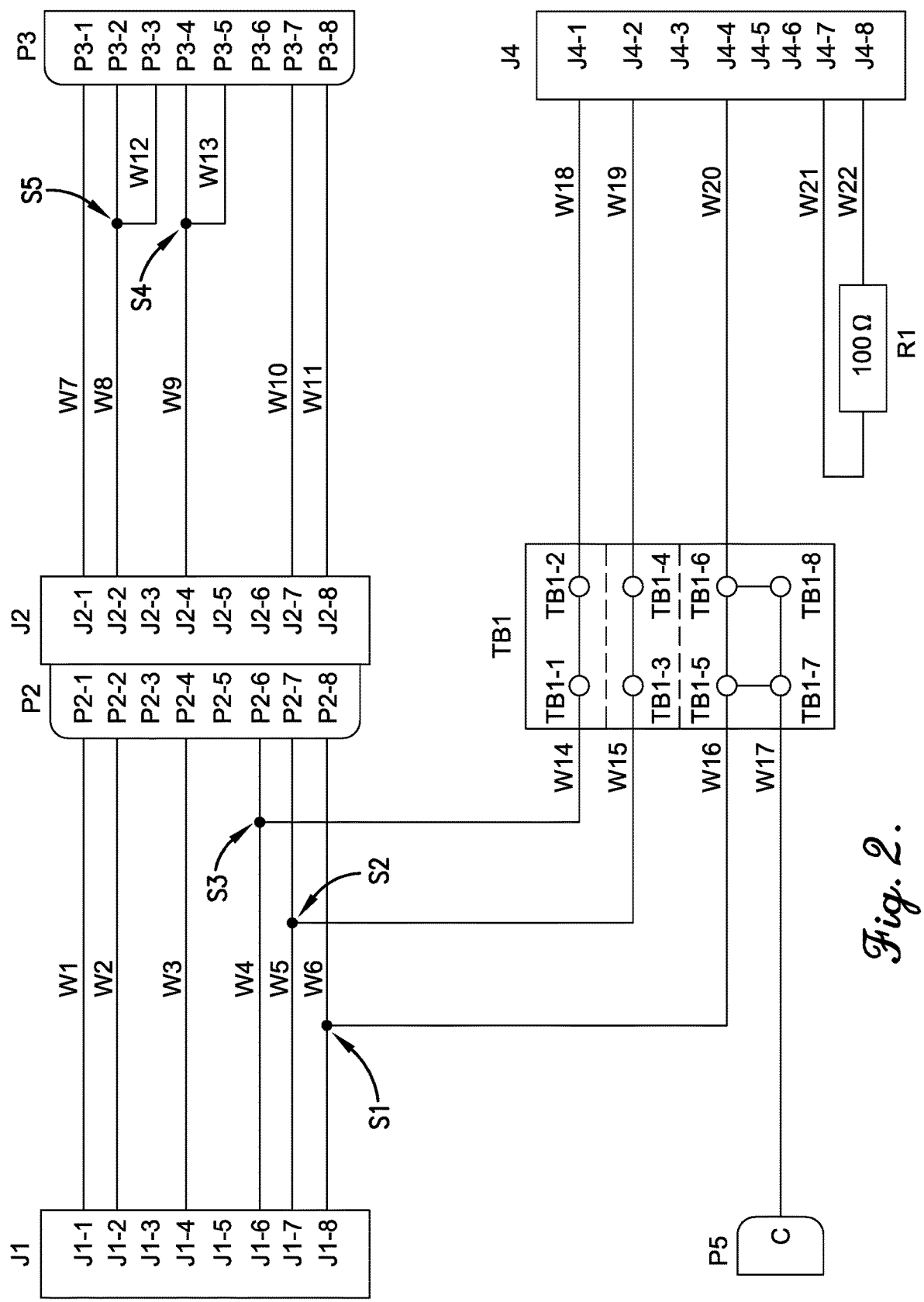
FIG. 2 is a schematic diagram of the unit under test of FIG. 1.
Figure 3:
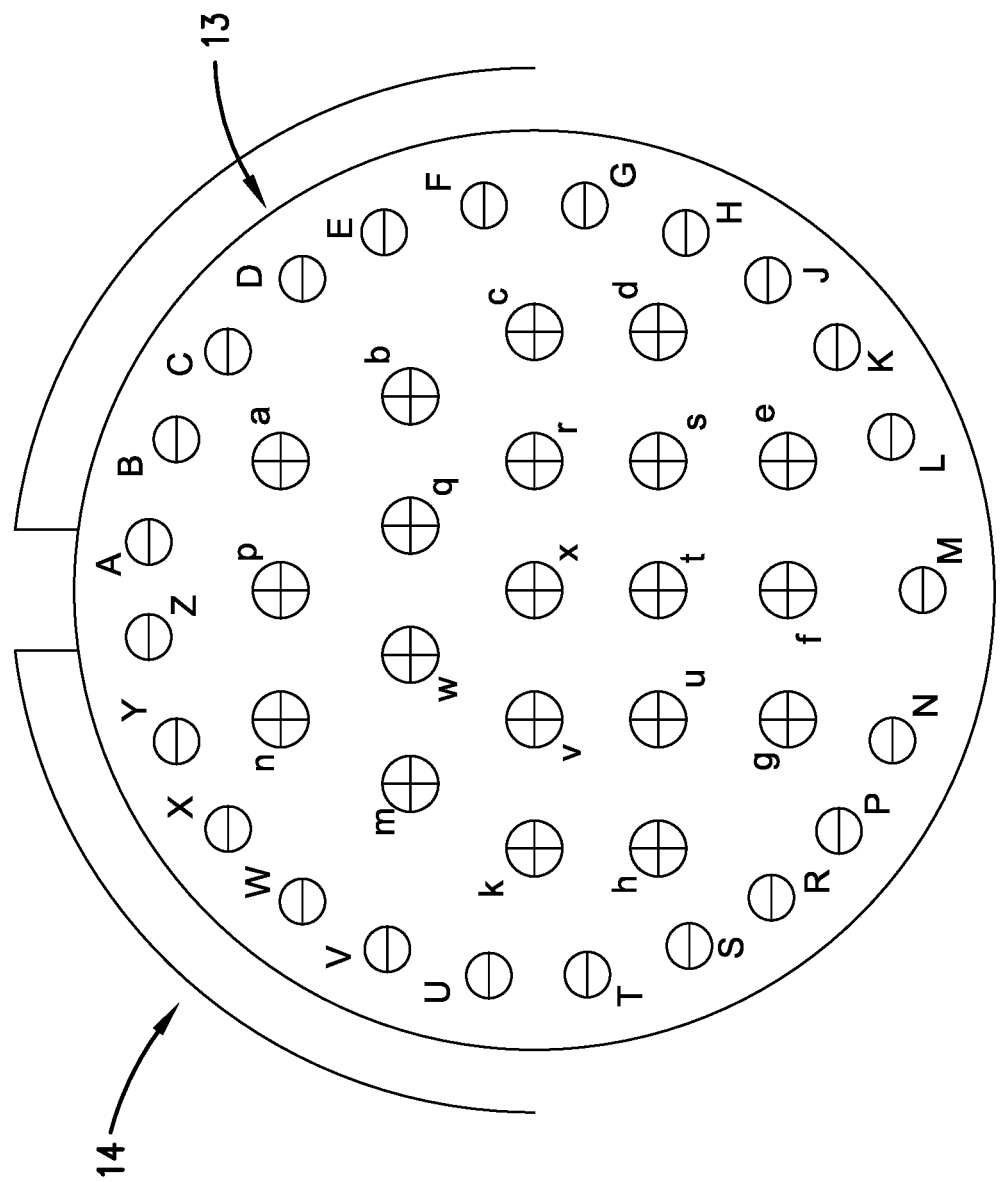
FIG. 3 is a schematic diagram of a topology of a contact arrangement of the unit under test of FIG. 1.

Turning to FIG. 1, a testing system 10 in which embodiments of the present invention may be implemented is illustrated. The system 10 may be provided for testing and analyzing an electrical wiring harness assembly 12. The electrical wiring harness assembly 12 may include one or more cables, connectors, switches, relays, resistors, diodes, or the like with one or more nodes, such as multi-node wire harnesses. A schematic of an example electrical wiring harness assembly 12 is depicted in FIG. 2. The electrical wiring harness assembly 12 comprises connectors J1, J2, J4, P2, P3, P5, terminal block TB1, wires W1, W2, W3, W4, W5, W6, W7, W8, W9, W10, W11, W12, W13, W14, W15, W16, W17, W18, W19, W20, W21, W22, resistor R1, and splices S1, S2, S3, S4, S5. The connectors J1, J2, J4, P2, P3 may each include a number of contacts: connector J1 includes contacts J1-1, J1-2, J1-3, J1-4, J1-5, J1-6, J1-7, and J1-8; connector P2 includes contacts P2-1 through P2-8; connector J2 includes contacts J2-1 through J2-8; etc. Connector P5 may include a "coax" connector, with a single center contact "C" and a shield connected to ground (not depicted). Terminal block TB1 may include a number of contacts TB1-1, TB1-2 . . . , TB1-8, and a number of internal interconnections TB1-1-2, TB1-3-4, TB1-5-6, TB1-5-7, TB1-6-8, TB1-7-8. The electrical wiring harness assembly 12 may include a harness 14 for connecting to equipment. An exemplary contact arrangement 13 for the harness is depicted in FIG. 3 with contacts A, B, C, D, E, F, G, H, J, K, L, M, N, P, R, S, T, U, V, W, X, Y, Z, a, b, c, d, e, f, g, h, k, m, n, p, q, r, s, t, u, v, w, x.

Figure 4:
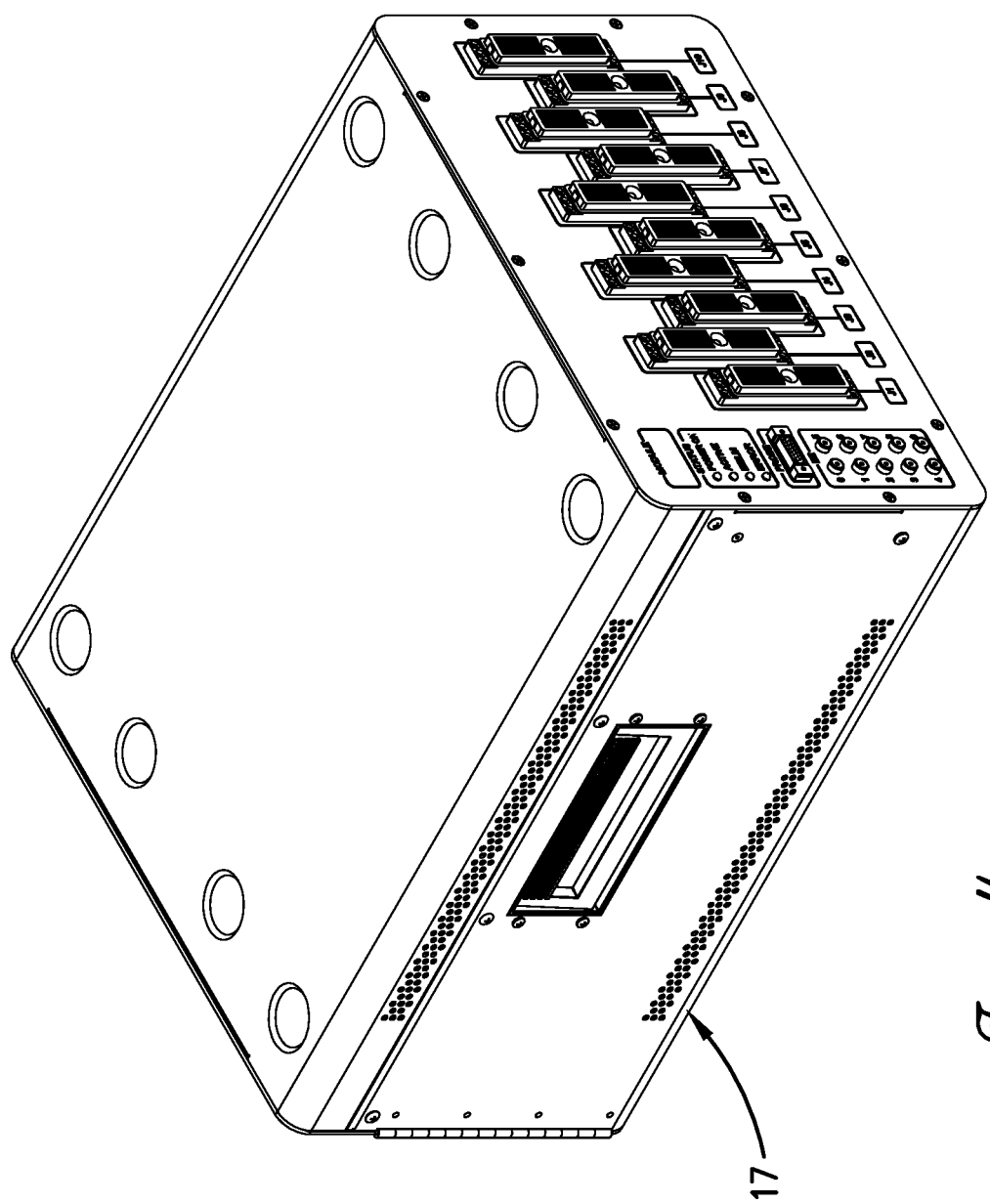
FIG. 4 is a perspective view of an exemplary stimulus and measurement device of the test system of FIG. 1.
Figure 5:
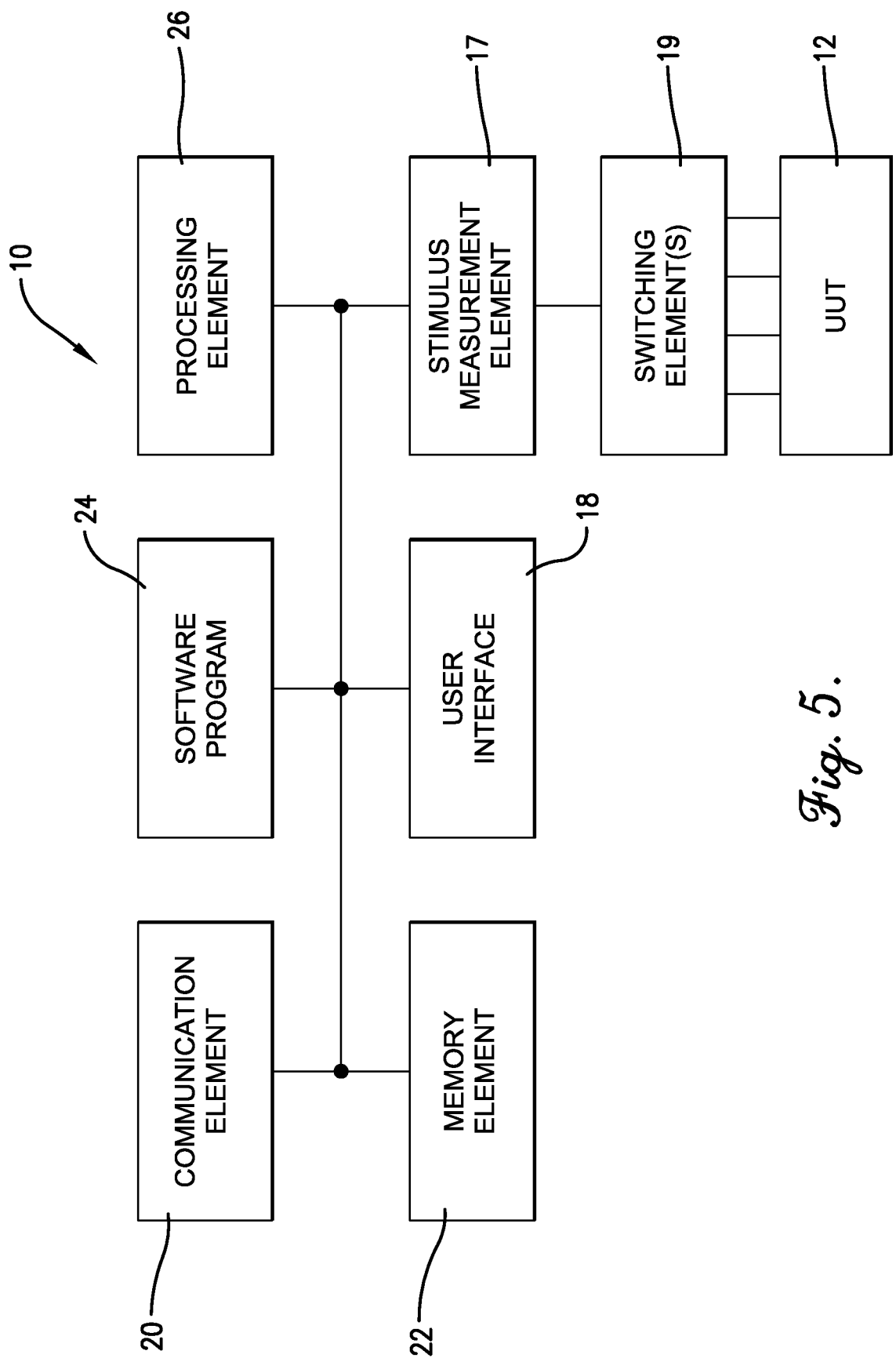
FIG. 5 is a schematic diagram depicting select components of the test system of FIG. 1.

Turning to FIGS. 4 and 5, the system 10 broadly comprises a harness interface 16, a stimulus and measurement device 17, a switching element 19 (shown in FIG. 5), a user interface 18, a communication element 20, a memory element 22, a software program 24, and a processing element 26. The harness interface 16 is configured to connect to the mating connector 14 of the electrical wiring harness assembly 12.

The stimulus and measurement device 17 is configured to generate a signal for performing tests on the electrical wiring harness assembly 12. The stimulus and measurement device 17 may be configured to generate a voltage, current, waveform, or the like, and measure various electrical properties of the electrical wiring harness assembly 12 in response to the stimuli. The switching element 19 is configured to connect the stimulus and measurement device 17 to the harness interface 16. The switching element 19 may comprise a switching matrix, such as a switch module, or pluralities thereof. In some embodiments, the switching element 19 may be integrated into the stimulus and measurement device 17. In some embodiments, the switching element 19 may comprise a switch module connected to the stimulus and measurement device 17.

The user interface 18 generally allows the user to utilize inputs and outputs to interact with the system 10. The user interface 18 may be in communication with the stimulus and measurement device 17 via a wired and/or wireless connection, as schematically represented by line 21. The wired or wireless connection 21 may comprise an ethernet cable, a USB cable, a WiFi connection, a Bluetooth™ connection, or any of the communication techniques described below in connection with the communication element 20. Inputs may include buttons, pushbuttons, knobs, jog dials, shuttle dials, directional pads, multidirectional buttons, switches, keypads, keyboards, mice, joysticks, microphones, touch screens, mouse pads, or the like, or combinations thereof. Outputs may include audio speakers, lights, dials, meters, printers, screens, displays, or the like, or combinations thereof. With the user interface 18, the user may be able to control the features and operation of what is displayed. While FIG. 1 depicts the testing system 10 as comprising various components integrated in separate housings, the components of the testing system 10 may be integrated and/or connected in any number of ways without departing from the scope of the present invention. For example, in some embodiments, all the components of the system 10 may be integrated into a single device with a single housing.

The communication element 20 generally allows communication between the system 10 and other testing systems, external devices, laptops, computers, or the like. The communication element 20 may include signal or data transmitting and receiving circuits, such as antennas, amplifiers, filters, mixers, oscillators, digital signal processors (DSPs), and the like. The communication element 20 may establish communication wirelessly by utilizing radio frequency (RF) signals and/or data that comply with communication standards such as cellular 2G, 3G, 4G or 5G, Institute of Electrical and Electronics Engineers (IEEE) 802.11 standard such as WiFi, IEEE 802.16 standard such as WiMAX, Bluetooth™, or combinations thereof. In addition, the communication element 20 may utilize communication standards such as ANT, ANT+, Bluetooth™ low energy (BLE), the industrial, scientific, and medical (ISM) band at 2.4 gigahertz (GHz), or the like. Alternatively, or in addition, the communication element 20 may establish communication through connectors or couplers that receive metal conductor wires or cables, like Cat 6 or coax cable, which are compatible with networking technologies such as ethernet. In certain embodiments, the communication element 20 may also couple with optical fiber cables. The communication element 20 may be in communication with the user interface 18, the memory element 22, and/or the processing element 26.

The memory element 22 may include electronic hardware data storage components such as read-only memory (ROM), programmable ROM, erasable programmable ROM, random-access memory (RAM) such as static RAM (SRAM) or dynamic RAM (DRAM), cache memory, hard disks, floppy disks, optical disks, flash memory, thumb drives, universal serial bus (USB) drives, or the like, or combinations thereof. In some embodiments, the memory element 22 may be embedded in, or packaged in the same package as, the processing element 26. The memory element 22 may include, or may constitute, a "computer-readable medium." The memory element 22 may store the instructions, code, code segments, software, firmware, programs, applications, apps, services, daemons, or the like that are executed by the processing element 26. In an embodiment, the memory element 22 stores the software application/program 24. The memory element 22 may also store settings, data, documents, sound files, photographs, movies, images, databases, and the like.

The processing element 26 may include electronic hardware components such as processors. The processing element 26 may include microprocessors (single-core and multi-core), microcontrollers, digital signal processors (DSPs), field-programmable gate arrays (FPGAs), analog and/or digital application-specific integrated circuits (ASICs), or the like, or combinations thereof. The processing element 26 may generally execute, process, or run instructions, code, code segments, software, firmware, programs, applications, apps, processes, services, daemons, or the like. For instance, the processing element 26 may execute the software application/program 24. The processing element 26 may also include hardware components such as finite-state machines, sequential and combinational logic, and other electronic circuits that can perform the functions necessary for the operation of the current invention. The processing element 26 may be in communication with the other electronic components through serial or parallel links that include universal busses, address busses, data busses, control lines, and the like.

The processing element 26 is configured to perform one or more tests on the electrical wiring harness assembly 12 via the switching element 19 and the harness interface 16, analyze the results, and output the results in natural language via the user interface 18. For example, the processing element 26 may be configured to determine prospective error types for faults detected in the electrical wiring harness assembly 12. For each detected fault, the processing element 26 may be configured to rank various possible error types. The processing element 26 may be configured to assess the likelihood of each error type based on the results of other individual tests to determine if such additional test results either confirm or reject the specific hypothesis. The processing element 26 may be configured to report probable error type in natural language via the user interface 18. The reporting may comprise displaying the natural language on a display of the user interface 18, printing the natural language via a paper printer of the user interface 18, outputting the natural language to a data file, or the like.

For example, the wire harness test faults can be grouped into three major types: continuity, also known as "open circuit" faults; shorts, also known as "isolation" or "leakage" faults; component measurements, such as specific resistance measurements, capacitive measurements, diode checks, and others. Each of the error types can have a variable number of root causes for the test failure.

Figure 6:
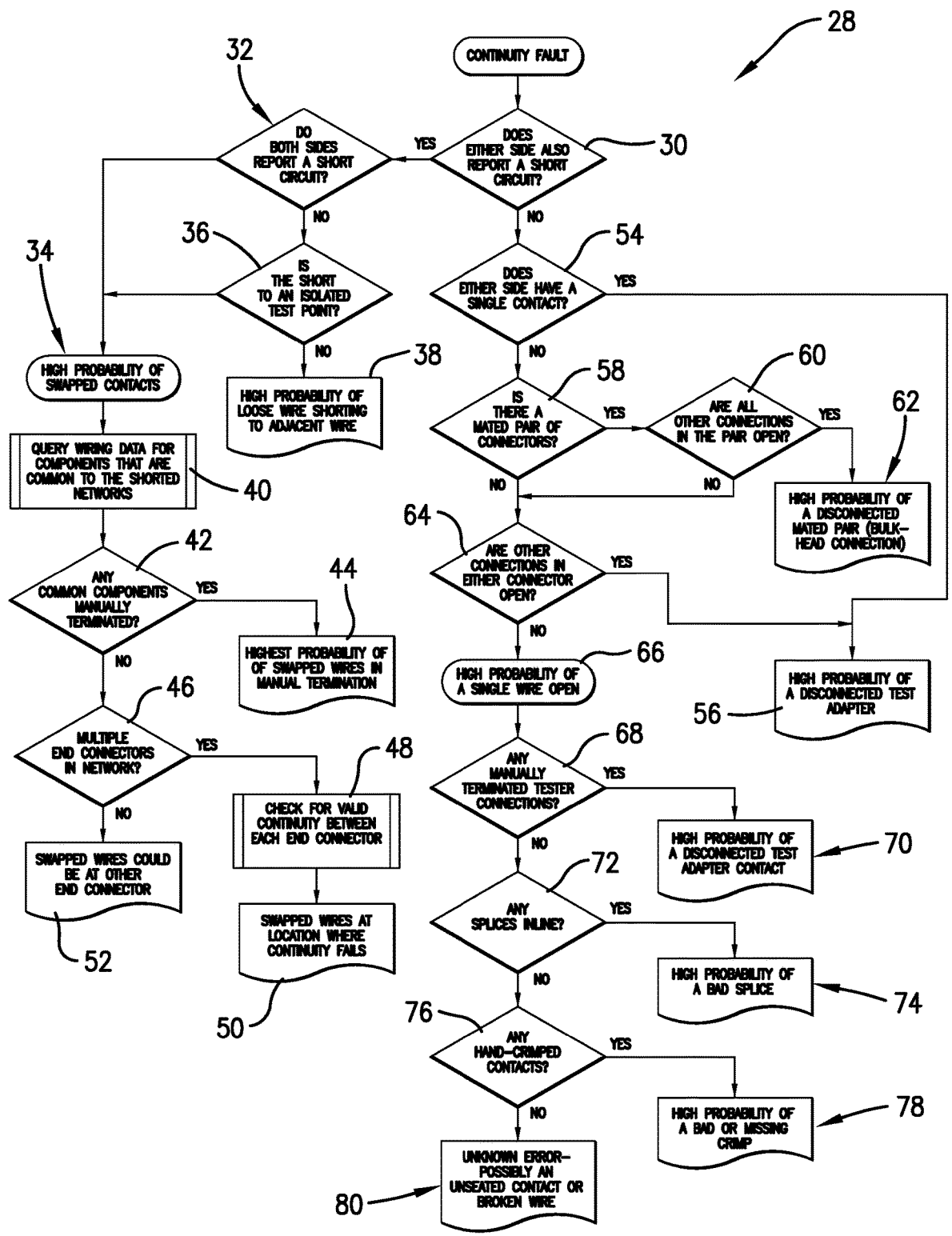
FIG. 6 is a flowchart illustrating an exemplary method of analyzing a continuity fault according to an embodiment of the present invention.

In one embodiment, the processing element 26 may be configured to analyze the test results according to the flowchart 28 in FIG. 6 when the processing element 26 detects a continuity fault. Neither the totality of possible error types, nor their relative order are provided in FIG. 6, but rather, it depicts an exemplary flowchart the processing element 26 may be configured to follow in order to identify the error type. Some of the steps depicted in FIG. 6 may be performed by the processing element 26 while other steps may comprise prompts that the processing element 26 is configured to display on the user interface 18. The processing element 26 may be configured to determine a set of possible error types for the continuity fault in an order according to their likelihood.

The processing element 26 may be configured to determine whether either side of the assembly 12 presents a short circuit, as depicted in step 30. If either side of the assembly 12 does present a short, then the processing element 26 may be configured to determine whether both sides present a short circuit, as depicted in step 32. If both sides present a short, the processing element 26 may be configured to conclude that there is a high probability the error type includes swapped contacts, as depicted in step 34. If both sides do not present a short, the processing element 26 may be configured to determine whether the short is presented at an isolated test point, as depicted at step 36. If so, the processing element 26 may be configured to conclude that there is a high probability the error type includes swapped contacts, as depicted in step 34. If not, the processing element 26 may be configured to conclude there is a high probability the error type includes a loose wire adjacent to the wire under test causing the short, as depicted in step 38.

To test the null hypothesis, if either side, or both sides of the reported open circuit also reports a short circuit, then the processing element 26 may be configured to determine that the most likely cause of the continuity failure is a reversal of the connections between the two shorted wires, as depicted in step 34. Under current solutions, scans for such short circuits in the event of a continuity failure do not provide reporting of the specific contacts where the error occurs, but instead require a knowledgeable user to look for circuit locations where the two shorted networks are in close physical proximity to each other. Since test systems do not generally have access to the topology of the unit under test 12, and instead typically report failing addresses in the order the end points are connected to the tester. Further, the reported locations may be in connections that are not physically near each other. Thus, embodiments of the present invention provide improved reporting of the likely physical location of the test fault.

The processing element 26 may be configured to query wiring data stored in the memory element 22 for components that are common to the shorted networks, as depicted in step 40. The processing element 26 may be configured to determine whether any common components are manually terminated, as depicted in step 42. If the processing element 26 determines there are common components manually terminated, then the processing element 26 may be configured to conclude there is a high probability the error type includes swapped wires in manual termination, as depicted in step 44. If the processing element 26 determines there are not any common components manually terminated, then the processing element 26 may be configured to determine whether multiple end connectors are in the network, as depicted in step 46. If so, then the processing element 26 may be configured to check, or prompt the user to check, for valid continuity between each end connector, as depicted in step 48, and to determine whether there are swapped wires at any location where continuity fails, as depicted in step 50. If there are not multiple end connectors, then the processing element 26 may be configured to conclude the error type includes swapped wires at either end connector, as depicted in step 52.

If the processing element 26 does not detect a short circuit, then the processing element 26 may be configured to examine test results for all other connections through each component within the continuity path. As depicted in step 54, the processing element 26 may be configured to determine whether either side of the assembly 12 has a single contact. If so, the processing element 26 may be configured to conclude that there is a high probability the error type includes a disconnected test adapter, or harness interface 16, as depicted in step 56. If the processing element 26 determines neither side has a single contact, then the processing element 26 may be configured to determine whether there is a mated pair of connectors, as depicted in step 58. If there are, then the processing element 26 may be configured to determine whether all other connections in the pair are open, as depicted in step 60. If the processing element 26 detects that all other connections through a specific component are also open, then processing element 26 may be configured to determine a high likelihood that the error type includes the component so identified is disconnected, as represented in step 62.

For example, the processing element 26 may determine an open circuit between contacts J1-1 and P3-1, but the processing element 26 determines that J1-1 nor P3-1 do not have a short circuit to any other points, then the processing element 26 may be configured to determine, depending on if certain other circuits are determined to also have discontinuity, the root cause of the open circuit can be inferred. If, for example, the processing element 26 determines that there are open circuits between points J1-2 and P3-2, J1-4 and P3-4, J1-7 and P3-7, J1-8 and P3-8, but not between points P3-2 and P3-3, P3-4 and P3-5, J1-6 and J4-1, J1-7 and J4-2, J1-8 and J4-4, then the processing element 26 may be configured to determine the common point of failure is the connection between the mated pair of connectors P2 and J2.

The processing element 26 may be configured to direct the user interface 18 to report the root cause. For example, the processing element 26 may be configured to report the following: Connectors P2 and J2 are likely disconnected in the UUT Or, if more detailed information is desired, the processing element 26 may be configured to direct the user interface 18 to report the test results that were included in making the conclusion of the probable root cause:

Continuity failures detected between J1 and P3, but not J1 and J4, nor P3 and P3, are most likely due to connectors P2 and J2 disconnected in the UUT However if, in addition to the open circuits passing through the connection between P2 and J2, the processing element 26 determines that there is no continuity between pins P3-2 and P3-3 and P3-4 and P3-5, then the processing element 26 may be configured to conclude that the disconnection is at P3, most likely due to P3 not being connected to the harness interface 16:

Connector P3 most likely not connected to the test adapter

If the processing element 26 determines that continuity failure does not share any attributes with any other failures reported, then attributes that show a more significant correlation to root causes are examined. If there is not a mated pair of connectors or if the other connections are not open, then the processing element 26 may be configured to determine whether other connections in either connector/harness are open, as depicted in step 64. If there are, then the processing element 26 may be configured to conclude there is a high probability the error type includes a disconnected test adapter, as depicted in step 56.

If there is not a mated pair of connector or if the other connections are not open, then the processing element 26 may be configured to determine that there is a high probability the error type includes a single wire being open, as depicted in step 66. The processing element 26 may be configured to determine there is a high likelihood the error type includes failure of connections between the electrical wiring harness assembly 12 and the testing system 10 that utilize a single contact, such as an electrical clip, as represented in step 70, typically known as a crocodile or alligator clip. The processing element 26 may be configured to determine the error type is the result of bad wire splices, as represented by steps 72 and 74, hand terminated contacts, as represented by steps 76 and 78, contacts not properly seated in the connector shell, or broken wires, as represented by step 80.

Figure 7:
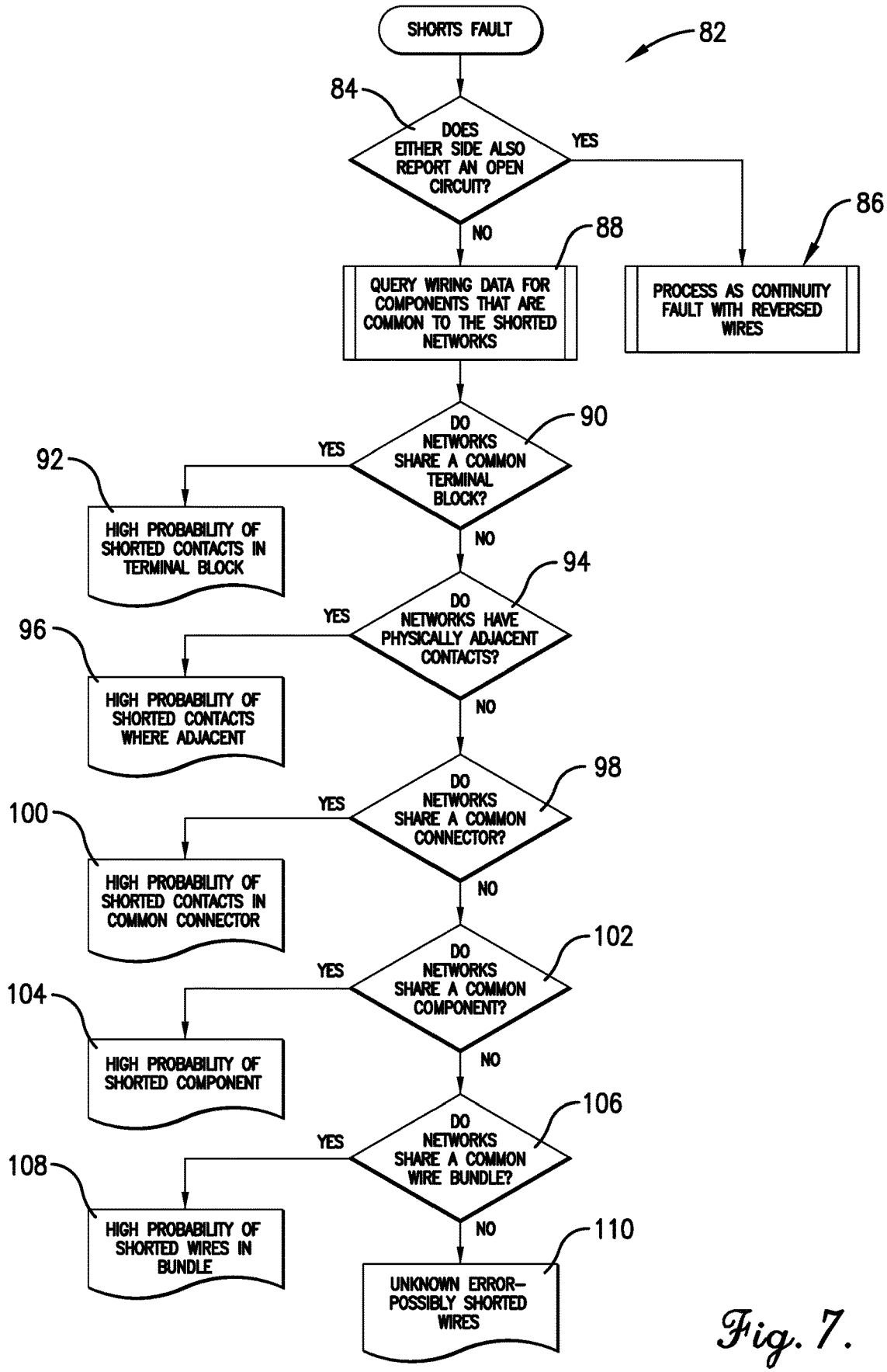
FIG. 7 is a flowchart illustrating an exemplary method of analyzing a short fault according to an embodiment of the present invention.

With current solutions, shorts between physically distant points in the electrical wiring harness assembly 12 are commonly reported by wire/harness testers due to test methods not being based on the topology of the electrical wiring harness assembly 12, but instead on the topology of the testing system itself. The test system 10 generally selects a single end point contact, in each network of contacts interconnected by wires in the electrical wiring harness assembly 12, from which to perform a test for a short circuit to said network of contacts. When a short is detected, the test points reported may not be in physical proximity to each other within the electrical wiring harness assembly 12. Embodiments of the present invention enables examining the detailed wire and component data for the electrical wiring harness assembly 12 to determine the most probable sources for the reported short circuit. The flowchart 82 of FIG. 7 depicts an exemplary series of steps the processing element 26 may be configured to perform for detecting a root cause of a short according to an embodiment of the present invention. Similar to flow chart 28, some of the steps depicted may comprise actions taken by the processing element 26 and/or may include prompts that the processing element 26 displays on the user interface 18 and corresponding information obtained in response to the prompts.

Referring to step 84, the processing element 26 may be configured to determine whether either side of the assembly 12 also presents an open circuit. If so, the processing element 26 may be configured to analyze the fault as a continuity fault with reversed wires as depicted in the flowchart of FIG. 6. If neither side presents an open circuit, the processing element 26 may be configured to query wiring data stored in the memory element 22 for components that are common to the shorted networks, as depicted in step 88. The processing element 26 may be configured to determine whether the networks share a common terminal block, as depicted in step 90. If so, then the processing element 26 may be configured to conclude there is a high probability the error type includes shorted contacts in the terminal block, TB1, for example, as depicted in step 92. If the networks do not share a common terminal block, the processing element 26 may be configured to determine whether the networks have physically adjacent contacts, as depicted in step 94. If so, the processing element 26 may be configured to conclude there is a high probability the error type includes shorted adjacent contacts, as depicted in step 96.

If the networks do not have physically adjacent contacts, the processing element 26 may be configured to determine whether the networks share a common connector/harness, as depicted in step 98. If so, then the processing element 26 may be configured to conclude there is a high probability the error type includes shorted contacts in the common connector/harness, as depicted in step 100. If the networks do not share a common connector, then the processing element 26 may be configured to determine whether the networks share a common component, as depicted in step 102. If so, the processing element 26 may be configured to conclude there is a high probability the error type includes a shorted component. If the networks do not share a component, the processing element 26 may be configured to determine whether they share a common wire bundle, as depicted in step 106. If so, the processing element 26 may be configured to conclude there is a high probability the error type includes shorted wires in the bundle, as depicted in step 108. If not, the processing element 26 may be configured to conclude the error type is unknown/shorted wires, as depicted in step 110.

For example, a short between wires W16 and W10 of the electrical wiring harness assembly 12 depicted in FIG. 2 might be reported as having been found from P3-7 to P5-C:

FF P3-7 P5-C SHORT<30.0K OHM

It can be seen that P3 and P5 are physically distant from each other, and therefore, the reported short between these two connectors does not provide the user with sufficient information to troubleshoot the actual root cause of the error. If the above referenced short circuit is not associated with one or more open circuits, then reversed wire connections are not indicated. The most likely error type for such a test result is a connection that is at, or near, a component which contains both circuits. The coupled connectors P2 and J2 as well as the end connectors J1 and P3, and the terminal block TB1 are examples of such components for the above referenced circuits. Those schooled in the art of diagnosing wire/harness systems recognize that many terminal blocks are modular in nature, with the internal interconnections TB1-1-2, TB1-3-4, and TB1-5-6-7-8, being determined by the particular module part number used, and additionally, industry practice is to manually connect wires to terminal blocks, the most likely location for the short is between the connections at TB1. Thus, the processing element 26 may be configured to report the following via the user interface 18:

Short circuit found between wires W10 and W16, is most likely found at TB1

However, if the short circuit is not discovered at the terminal block, then the next probable location would be any one of the above referenced connectors J1, P2, J2, or P3. Thus, the processing element 26 may be configured to report the following via the user interface 18:

Short circuit found between wires W10 and W16, is most likely found at TB1. If not found there, inspect wires W5 and W6 between J1-7 and P2-7 and J1-8 and P2-8 or wires W10 and W11 between J2-7 and P3-7 and J2-8 and P3-8

The details of the error analysis above are exemplary, and do not indicate the only configuration of the processing element 26 to determine the root cause of an error. Those schooled in the art of wire/harness testing are familiar with other descriptive text to indicate the location of the root cause of a test result and such other text is included herein. As an additional example, the processing element 26 may be configured to report possible causes via the user interface 18 separately such that the user is shown a single likely root cause. Further, the processing element 26 may be configured to display a prompt on the user interface 18 so that the user must respond to the prompt to indicate if the reported text was correct, or not. If not, the processing element 26 may be configured to report the next alternate root cause via the user interface 18:

Short circuit found between wires W10 and W16, is most likely found at TB1

As shown in FIG. 7, for short circuit faults reported, if the processing element 26 determines that either network also contains an open circuit, then the processing element 26 may be configured to examine reversed wires category of root causes, as represented by step 86. Otherwise, the processing element 26 may be configured to check networks for commonality among categories of root causes in descending order of likelihood of causing the fault. The order of the fault causes shown in FIG. 7 are exemplary, and in some embodiments, the order in which they are tested is adjusted based on dependencies and historical results stored in the memory element 22—such that unambiguous root causes, followed by the most common root causes are tested first.

In some embodiments of the present invention, as shown in FIG. 3, the topology of component contact arrangements 13 are stored on the memory element 22, and the processing element 26 may be configured to examine the contact arrangements 13 to determine if contacts c and r contained in the two shorted circuits are physically adjacent to each other even if their pin names do not appear in sequence. The processing element 26 may be configured to receive a signal representative of confirmation of this via the user interface 18.

When the processing element 26 tests a component with a value other than a simple continuity measurement, the processing element 26 may be configured to clearly identify the component as the most common source of the error type if the processing element 26 determines the test results are not a simple short or open measurement. That is, if R1 is measured, and the resistance is substantially high, or above a certain threshold, then the processing element 26 may be configured to conclude the error type includes an open circuit. If the resistance is substantially low, or below a threshold, then the processing element 26 may be configured to conclude the error type includes a short circuit. For such test results, the processing element 26 may be configured to conclude the likely error type is a wiring error. However, if the processing element 26 determines that the measured value is within a range that is known to be greater than a short circuit, but less than an open circuit, then the processing element 26 may be configured to conclude the most likely error type is the resistor itself and therefore direct the user interface 18 to report, for example, the following:

Resistance failure between J4-7 and J4-8 most likely due to component R1.

Value should be 100 ohms+/−10% but is reported as 51.2 ohms

In some embodiments of the present invention, the processing element 26 is configured to execute supplemental tests to further diagnose the error type. For example, if the processing element 26 determines a test from end point J1-8 to J4-4 fails, the processing element 26 may be configured to perform a continuity test between P5-C and J4-4. If the processing element 26 determines this supplemental test passes, the processing element 26 may be configured to provide additional information, via the user interface 18, to suggest that the error type is in the connection to wire W15, most likely at the splice S1 to wire W6.

The processing element 26 is configured to report the determined error type in "natural language" rather than in a more encoded format. That is, the processing element 26 is configured to augment classical test report format such as:

CC J1-A J5-A OPEN>30.0M OHM
XT J1-A J5-B WIRED<0.100 OHM
XT J1-B J5-A WIRED<0.100 OHM

Particularly, the processing element 26 is configured to report such test reports with a sentence, in the preferred language of the user via the user interface 18, such as for an English language speaker:

Continuity failure between J1-A and J5-A is most likely pins 1 and 3, or 2 and 4 reversed in terminal block TB1

In some embodiments, the processing element 26 may be configured to receive the preferred language via the user interface 18, such as, for example, English and/or Spanish. For example, if the processing element 26 receives a signal representative of a selection of Spanish from the user interface 18, the processing element 26 may be configured to report via the user interface 18 the same report in Spanish:

Lo más probable es que la falla de continuidad entre J1-A y J5-A sea causada por los pines 1 y 3, o 2 y 4 intercambiar en el bloque de terminales TB1

As shown in FIG. 8, the memory element 22 may have stored thereon a table, or tables, in a SQL, or no-SQL, database to store the error types in association with natural language terms, phrase order values indicating an order of the terms (depending on the selected preferred language of the user). Variables in the text are included by foreign key reference, or other methods consistent with the data storage and retrieval system utilized in the specific embodiment of the present invention. Those skilled in the art of database design, or software internationalization techniques, can understand that a number of methods are available to extract the relevant data in the proper sentence structure for the user's native language. A SQL query that selects fragments of a sentence filtered by the selected language and error type and joins one or more other tables to provide specific error location information in the proper order would have a format represented by the exemplary query statement below:

SELECT Term, T.component_value FROM Natural_Language_Building_Table
LEFT JOIN Component_Table T ON Foreign_Key=T.Primary_Key
WHERE Error Type='Open in Component'
AND Language='English'
ORDER BY Phrase_Order The SQL query statement above is representative of the type of statement used by the present invention and its inclusion here does not limit other statements to be used that would be obvious to those skilled in the art of database management.

In some embodiments, the processing element 26 may be configured to receive from the user interface 18 signals representative of the actual error type, store the error type in the memory element 22, and utilize computerized machine learning techniques to adjust the order of significances of various attributes and root causes based on the historical data from previous testing stored on the memory element 22.

Figure 9:
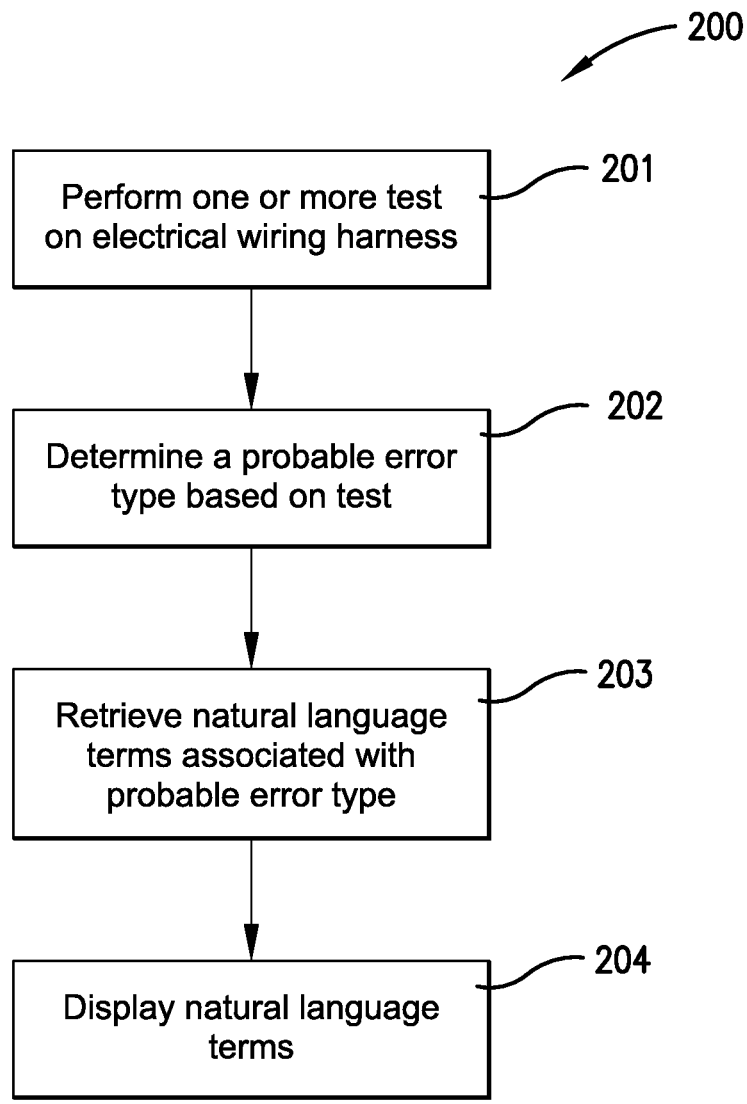
FIG. 9 is a flowchart illustrating a method of analyzing an electrical wiring harness assembly according to an embodiment of the present invention.

The flow chart of FIG. 9 depicts the steps of an exemplary method 200 of analyzing an electrical wiring harness assembly. In some alternative implementations, the functions noted in the various blocks may occur out of the order depicted in FIG. 9. For example, two blocks shown in succession in FIG. 9 may in fact be executed substantially concurrently, or the blocks may sometimes be executed in the reverse order depending upon the functionality involved. In addition, some steps may be optional.

The method 200 is described below, for ease of reference, as being executed by exemplary devices and components introduced with the embodiments illustrated in FIGS. 1-8. However, a person having ordinary skill will appreciate that responsibility for all or some of such actions may be distributed differently among such devices or other computing devices without departing from the spirit of the present invention. One or more computer-readable medium(s) may also be provided. The computer-readable medium(s) may include one or more executable programs stored thereon, wherein the program(s) instruct one or more processing elements to perform all or certain of the steps outlined herein. The program(s) stored on the computer-readable medium(s) may instruct the processing element(s) to perform additional, fewer, or alternative actions, including those discussed elsewhere herein.

Referring to step 201, a plurality of tests are performed on the electrical wiring harness assembly. The plurality of tests may comprise a continuity fault test, an isolation fault test, a short circuit fault test, a measurement of one or more electrical characteristics of the electrical wiring harness assembly, and/or the like. This step may include connecting the assembly to a test system constructed according to an embodiment of the present invention. The test system may include one or more connectors or harness interfaces for connecting to both ends of the assembly, a stimulus generator and measurement device, a switching element, and/or the like. The test system may include a user interface, and this step may include displaying prompts, via a processing element of the test system, on the user interface, and receiving data from the user via the user interface.

Referring to step 202, a probable error type for the electrical wiring harness assembly is determined via a processing element. The probable error type may be determined based on historic data and/or according to analysis flow, which may include providing prompts on a user interface to receive data from the user.

Referring to step 203, natural language terms associated with the probable error type are retrieved. This step may include receiving at the user interface of the test system a selection of a preferred language. This step may include retrieving the natural language terms associated with the preferred language, and the phrase order values associated with the natural language terms of that preferred language. This step may also include retrieving one or more foreign keys associated with particular natural language terms. The foreign keys may comprise pointers or variables associated with one or more components of the assembly stored on the memory element.

Referring to step 204, the natural language terms are reported. This step may include displaying the natural language terms on the user interface of the test system. The natural language terms may be displayed in the preferred language and in the order corresponding to the phrase order value. For example, the first natural language term may be associated with a '1' and therefore be displayed first on the user interface.

The method 200 may include additional, less, or alternate steps and/or device(s), including those discussed elsewhere herein.

Additional Considerations

Although the present application sets forth a detailed description of numerous different embodiments, it should be understood that the legal scope of the description is defined by the words of the claims set forth at the end of this patent and equivalents. The detailed description is to be construed as exemplary only and does not describe every possible embodiment since describing every possible embodiment would be impractical. Numerous alternative embodiments may be implemented, using either current technology or technology developed after the filing date of this patent, which would still fall within the scope of the claims.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

The various operations of example methods described herein may be performed, at least partially, by one or more processing elements that are temporarily configured (e.g., by software) or permanently configured to perform the relevant operations. Whether temporarily or permanently configured, such processing elements may constitute processing element-implemented modules that operate to perform one or more operations or functions. The modules referred to herein may, in some example embodiments, comprise processing element-implemented modules.

Similarly, the methods or routines described herein may be at least partially processing element-implemented. For example, at least some of the operations of a method may be performed by one or more processing elements or processing element-implemented hardware modules. The performance of certain of the operations may be distributed among the one or more processing elements, not only residing within a single machine, but deployed across a number of machines. In some example embodiments, the processing elements may be located in a single location (e.g., within a home environment, an office environment or as a server farm), while in other embodiments the processing elements may be distributed across a number of locations.

Unless specifically stated otherwise, discussions herein using words such as "processing," "computing," "calculating," "determining," "presenting," "displaying," or the like may refer to actions or processes of a machine (e.g., a computer with a processing element and other computer hardware components) that manipulates or transforms data represented as physical (e.g., electronic, magnetic, or optical) quantities within one or more memories (e.g., volatile memory, non-volatile memory, or a combination thereof), registers, or other machine components that receive, store, transmit, or display information.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus.

Although the invention has been described with reference to the embodiments illustrated in the attached drawing figures, it is noted that equivalents may be employed and substitutions made herein without departing from the scope of the invention as recited in the claims of any subsequent regular utility application.

Having thus described various embodiments of the invention, what is claimed as new and desired to be protected by Letters Patent includes the following:

1. A computer-implemented method of analyzing an electrical wiring harness assembly with a fault, the computer-implemented method comprising:
   receiving, via a processing element of a testing system connected to the electrical wiring harness assembly, a plurality of disparate test results associated with the fault of the electrical wiring harness assembly, each of the plurality of test results comprising a line of text encoded in test report format;
   determining, via the processing element, a probable error type based on the test results;
   retrieving from a memory element, via the processing element, a plurality of natural language terms associated with the probable error type;
   reporting, via a user interface, the plurality of natural language terms;
   receiving, via the user interface, a signal representative of an actual error type;
   storing, via the processing element, the actual error type in association with the test results on the memory element; and
   adjusting an order of significance associated with the error type associated with the electrical wiring harness assembly based at least in part on the actual error type.

2. The computer-implemented method of claim 1, further comprising receiving, via the user interface, a selection of a preferred language, wherein the retrieving step comprises retrieving the plurality of natural language terms associated with the preferred language.

3. The computer-implemented method of claim 1, wherein the test results are indicative of an electrical characteristic.

4. The computer-implemented method of claim 1, wherein the test results are indicative of at least one of a continuity fault or an isolation fault.

5. The computer-implemented method of claim 1, wherein the plurality of natural language terms associated with the probable error type are stored in association with a classification of the electrical wiring harness assembly.

6. The computer-implemented method of claim 5, wherein the retrieving step comprises submitting the classification of the electrical wiring harness assembly and the probable error type to the memory element and receiving the plurality of natural language terms.

7. The computer-implemented method of claim 5, wherein at least one of the plurality of natural language terms comprises an identifier of a pin associated with the classification of the electrical wiring harness assembly.

8. A system for analyzing an electrical wiring harness assembly having a fault, the system comprising:

a harness interface for contacting two or more pins of the electrical wiring harness assembly;

a stimulus and measurement device connected to the harness interface and configured to measure electrical characteristics of the electrical wiring harness assembly;

a memory element configured to store a plurality of error types in association with a plurality of natural language terms;

a user interface including a display configured to display text;

a processing element in communication with the stimulus and measurement device, the memory element, and the user interface, the processing element being configured to— receive a signal representative of disparate test results from the stimulus and measurement device, each of the test results comprising a line of text encoded in test report format, determine a probable error type based on the test results, retrieve from the memory element a plurality of natural language terms associated with the probable error type, direct the user interface to report each of the plurality of natural language terms, receive from the user interface a signal representative of an actual error type, store the actual error type in association with the test results on the memory element, and adjust an order of significance associated with the error type associated with the electrical wiring harness assembly based at least in part on the actual error type.

9. The system of claim 8, wherein the user interface is configured to receive a selection of a preferred language.

10. The system of claim 9, wherein the processing element is configured to retrieve from the memory element the plurality of natural language terms associated with the preferred language.

11. The system of claim 8, wherein the memory element is configured to store the plurality of natural language terms associated with the probable error type in association with a classification of the electrical wiring harness assembly.

12. The system of claim 11, wherein the processing element is configured to retrieve the plurality of natural language terms from the memory element based on the classification of the electrical wiring harness assembly and the probable error type.

13. The system of claim 11, wherein the memory element is configured to store an identifier of a pin associated with the classification of the electrical wiring harness assembly, the processing element is configured to retrieve the identifier of the pin and direct the user interface to display the identifier.

14. A computer-implemented method of analyzing an electrical wiring harness assembly with a fault and a classification, the computer-implemented method comprising:

performing, via a stimulus and measurement device, a plurality of tests on the electrical wiring harness assembly;

measuring, via the stimulus and measurement device, a plurality of electrical characteristics of the electrical wiring harness assembly;

receiving from the stimulus and measurement device a plurality of disparate test results associated with the tests on the electrical wiring harness assembly and the plurality of electrical characteristics of the electrical wiring harness assembly, each of the plurality of disparate test results comprising a line of text encoded in test report format;

determining, via a processing element, a determined probable error type based on the plurality of test results, the classification of the electrical wiring harness assembly, and an order of significance associated with one or more attributes associated with the classification of the electrical wiring harness assembly;

storing on a memory element a plurality of probable error types in association with natural language terms and classifications of electrical wiring harness assemblies;

retrieving from the memory element, via the processing element, a plurality of natural language terms associated with the determined probable error type and the classification of the electrical wiring harness assembly;

reporting, via a user interface, each of the plurality of natural language terms;

receiving, via the user interface, a signal representative of an actual error type;

storing, via the processing element, on the memory element the actual error type in association with the plurality of test results and the classification of the electrical wiring harness assembly; and implement, via the processing element, a machine learning technique to adjust the order of significance of with the one or more attributes associated with the classification of the electrical wiring harness assembly.

15. The computer-implemented method of claim 14, further comprising receiving, via the user interface, a selection of a preferred language, wherein the retrieving step comprises retrieving the plurality of natural language terms associated with the preferred language.

* * * * *